(12) United States Patent
Hurley

(10) Patent No.: US 6,706,594 B2
(45) Date of Patent: Mar. 16, 2004

(54) OPTIMIZED FLASH MEMORY CELL

(75) Inventor: Kelly T. Hurley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 09/905,517

(22) Filed: Jul. 13, 2001

(65) Prior Publication Data

US 2003/0013253 A1 Jan. 16, 2003

(51) Int. Cl.$^7$ ............................................. H01L 21/336
(52) U.S. Cl. ...................... 438/258; 438/257; 257/314; 257/315; 257/316
(58) Field of Search ............................... 438/257, 258; 257/314, 315, 316

(56) References Cited

U.S. PATENT DOCUMENTS

| | | | |
|---|---|---|---|
| 5,210,047 A | 5/1993 | Woo et al. | 437/43 |
| 5,731,242 A | * 3/1998 | Parat et al. | 438/586 |
| 5,994,733 A | 11/1999 | Nishioka et al. | 257/316 |
| 6,080,624 A | * 6/2000 | Kamiya et al. | 438/257 |
| 6,188,115 B1 | 2/2001 | Kamitani | 257/412 |
| 6,271,087 B1 | * 8/2001 | Kinoshita et al. | 438/258 |

OTHER PUBLICATIONS

H. Watanabe et al., "Novel 0.44um Ti–Salicide STI Cell Technology for High–Density NOR Flash Memories and High Performance Embedded Application,"Microelectronics Engineering Laboratory, *Memory Division, **Micro and Custom LSI Division, Toshiba Corporation, 8 Shinsugita–Cho, Isogo–ku, Yokohama, 235 Japan, pp IEDM 98–975–IEDM–978, 1998.

"Novel 0.44$\mu$m$^2$ Ti–Salicide STI Cell Technology for High Density NOR Flash Memories and High Performance Embledded Application", H. Watanabe et al., IEDM 98, pp. 975–978.

"A 130–mm$^2$, 256–Mbit NAND Flash with Shallow Trench Isolation Technology", Kenichi Imamiya et al., IEEE Journal of Solid–State Circuits, vol. 34, No. 11, Nov. 1999.

* cited by examiner

*Primary Examiner*—Amir Zarabian
*Assistant Examiner*—Jeff Vockrodt

(57) ABSTRACT

A flash memory comprising floating gate devices being connected to one-another through their source electrodes being self-aligned to their respective gate electrodes, a local tungsten interconnect making a substantially continuous connection to the sources. The flash memory is formed by forming floating gate devices, each comprising a floating gate, forming a source electrode for each floating gate device and connecting each source electrode together by a conductive implant into a defined active area, forming a nitride barrier layer overlying each transistor gate, forming a planarized insulation layer over the nitride barrier layer, removing portions of the planarized insulation layer while using the nitride barrier layer to self-align an interconnect via opening to the source electrodes, forming a metal interconnect into the interconnect via, the metal interconnect running a major length of the interconnected source electrodes and making contact therebetween, and forming a metal drain plug for each floating gate device.

20 Claims, 6 Drawing Sheets

OPTIMIZED FLASH MEMORY CELL

FIELD OF THE INVENTION

This invention relates to semiconductor fabrication processing and, more particularly, to a fabrication method for forming storage cells in semiconductor devices, such as non-volatile flash memory devices.

BACKGROUND OF THE INVENTION

Non-volatile semiconductor memory devices are currently used extensively through the electronics industry. One type of non-volatile semiconductor memory devices employs the use of floating gate memory cells that are able to retain and transfer charge through a variety of mechanisms which include avalanche injection, channel injection, tunneling, etc. A flash memory device is such a semiconductor device that utilizes a floating gate memory cell. As is the case with most semiconductors being fabricated, the industry continues to push for smaller devices that contain a larger number of memory cells than each previous generation. This is also the case for the flash memory device.

In a flash memory device, fabrication of the components that make up the floating gate transistor determines the ability of the device to be programmed and retain an electrical charge as well as the ability of the device to be reprogrammed by being erased (or the removal of the electrical charge). Flash memory cells comprising floating gate transistors are laid out in such a manner that a plurality of cells forms a memory array.

A device in the programmed state, i.e., charge stored on the floating gate, represents a stored "0" and a device in the non-programmed state, i.e., no charge stored on the floating gate, represents a stored "1." Reading a device in the programmed state will cause the device to conduct heavily, while reading a device in the non-programmed state the device will not conduct. Each floating gate transistor in the array has a common source line and the common source line requires sophisticated fabrication techniques.

The present invention provides a flash memory cell structure and method to fabricate a floating gate device having a self-aligned floating gate, a low resistant local interconnect to the source and a self-aligned drain electrode contact plug, all of which will provide enhanced operation of a flash memory cell device.

SUMMARY OF THE INVENTION

Exemplary implementations of the present invention include a flash memory device and processes to fabricate a flash memory device.

A first exemplary implementation of the present invention includes a flash memory device comprising a series of floating gate devices each having a floating gate self-aligned to a respective transistor gate electrode. The sources for each transistor gate are implanted so that they are interconnected by a common conductively doped active area. A metal interconnect runs a major length of interconnected source electrodes and makes substantially continuous contact therebetween. The metal interconnect may comprise a tungsten-based metal, such as tungsten/titanium. A metal self-aligned drain connecting to a respective drain may be comprised of tungsten/titanium as well.

A second exemplary implementation of the present invention includes process steps for forming a flash memory device on a semiconductor assembly by forming a series of floating gate devices, each having floating gate electrodes self-aligned to their respective transistor gate electrode. Implanted source electrodes connected together by a conductively doped active area are formed. Then, a nitride barrier layer is formed such that it overlies each transistor gate. Next, a planarized insulation layer is formed over the nitride barrier layer. Portions of the planarized insulation layer are removed while using the nitride barrier layer to self-align an interconnect via to underlying source electrodes.

Next, a metal local interconnect is formed into the interconnect via. The metal interconnect runs the major length of the source electrodes, while making contact therebetween. It is optional to simultaneously form metal drain plugs for each floating gate device and self-aligning each metal drain plug to an underlying drain electrode. The metal interconnect and the metal drain plug may be formed from a tungsten-based metal, such as tungsten/titanium.

DETAILED DESCRIPTION OF THE INVENTION

Exemplary implementations of the present invention directed to processes for fabricating a floating gate memory device are depicted in FIGS. 1–10.

Figure 1:
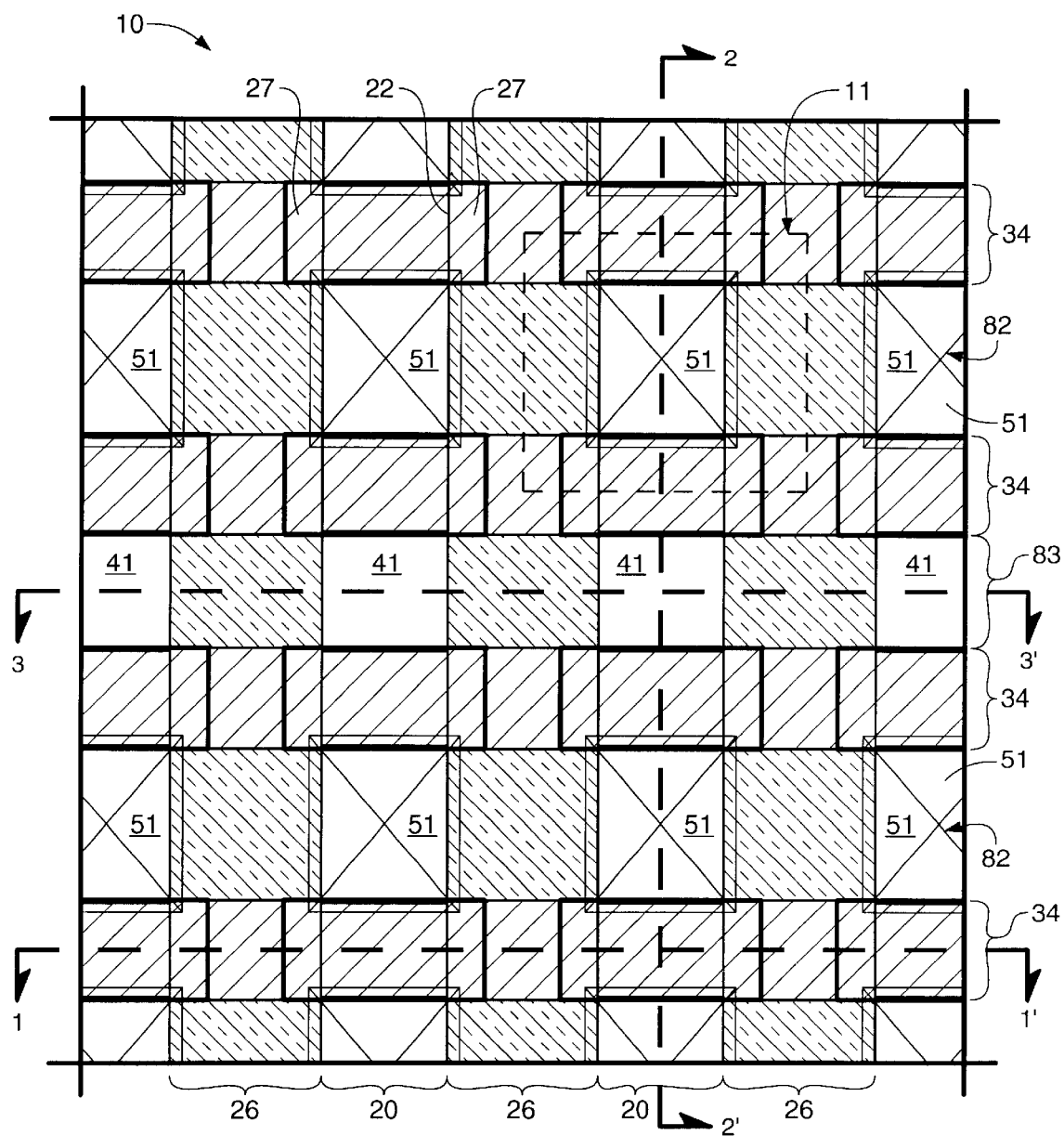
FIG. 1 is a top-down view depicting the layout of an array of flash cells, each cell utilizing a self-aligned floating gate, tungsten/titanium local interconnect and a self-aligned drain electrode contact plug.

Referring now to the top-down view of FIG. 1, a layout of an optimized flash cell on wafer substrate 10, is presented. A single flash cell is outlined by box 11 and is depicted in the subsequent cross-sectional views taken through the active areas 20 that define the location of the source, drain and channel of the floating gate devices to be formed. Shallow trench isolation 25 provides isolation between neighboring gate devices. Wordlines 34 run horizontally and overlie the self-aligned floating gates 22. Self-aligned floating gates 22 span between self-aligned sources and drains that reside in the confines of active areas 20. Self-aligned drain contacts 82 make contact to underlying drains 51 and tungsten local interconnects 83 make contact to underlying self-aligned sources 41.

Figure 2A:
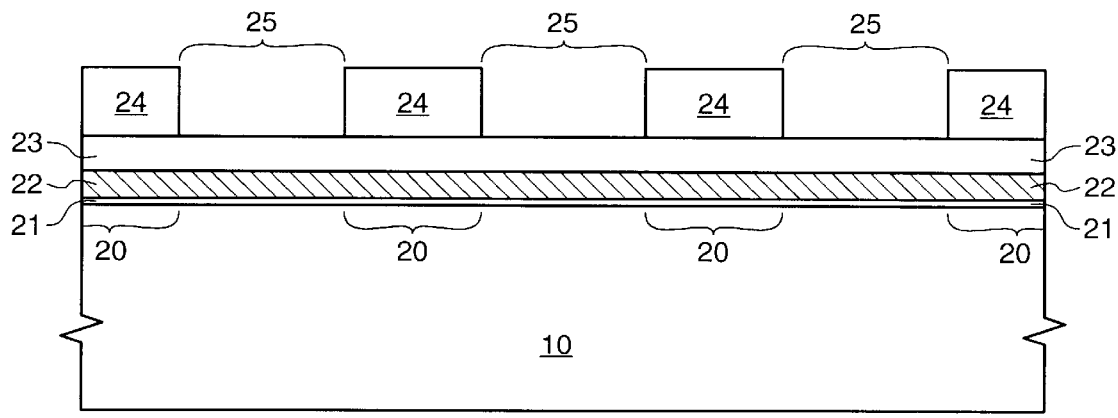
FIGS. 2A–2C are cross-sectional views taken through line 1–1' of FIG. 1 after the formation of shallow trench isolation and self-aligned floating gates.
Figure 2B:
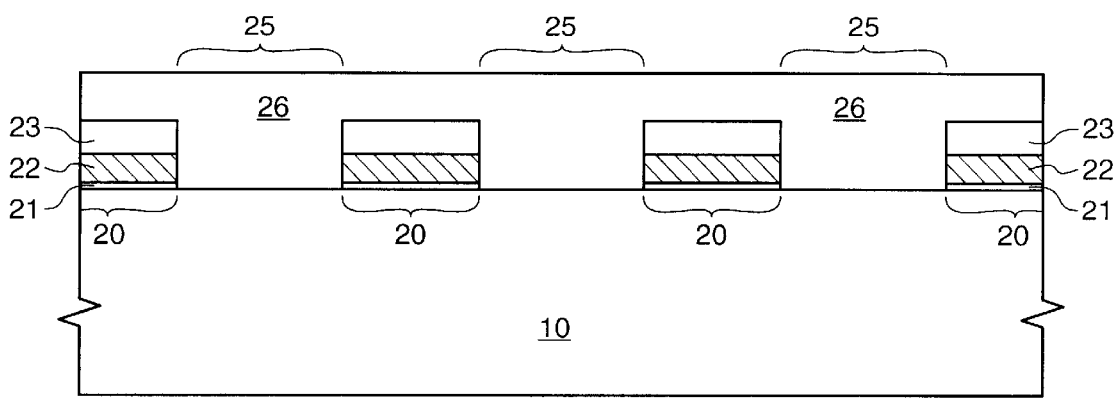
Figure 2C:
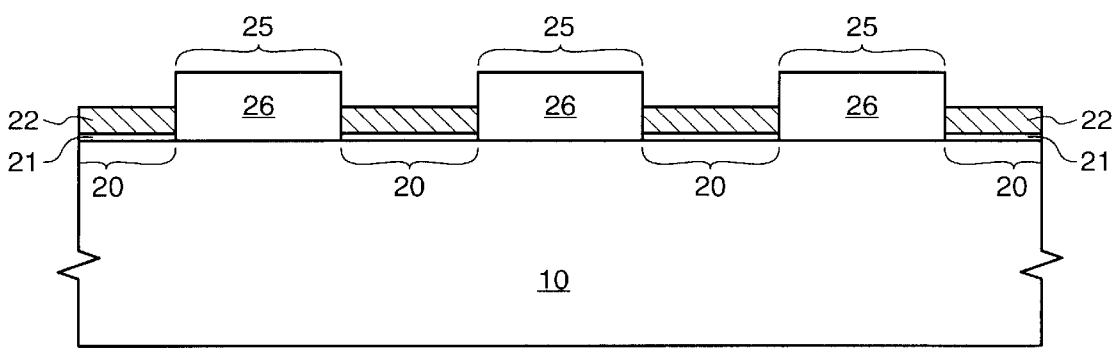

FIGS. 2A–2C are cross-sectional views of FIG. 1 taken through line 1–1'. Referring now to FIG. 2A, Oxide layer 21, polysilicon layer 22 and nitride layer 23 are formed on substrate 10. Material 24, such as photoresist, is formed to provide a pattern for a subsequent self-aligned floating gate etch and to define active areas 20 and isolation trenches 25.

Referring now to FIG. 2B an etch is performed to create isolation trenches 25 as well as self-aligned floating gates 22, with patterned gate oxide 21 lying underneath. Patterned nitride 23 overlies self-aligned floating gate 22. Isolation oxide 26 is formed to fill isolation trenches 25, as well as cover the self-aligned source stack of nitride 23, self-aligned source polysilicon 22 and gate oxide 21.

Referring now to FIG. 2C, isolation oxide 26 is planarized followed by the removal of patterned nitride 23 (seen in FIG. 2B) to form patterned shallow trench isolation 26 and also to define active areas 20. In this process, floating gate 22 becomes self-aligned to the transistor gate by virtue of being etched during the shallow trench isolation etch. Optional floating gate wings 27 (seen in overhead view of FIG. 1) may also be included.

Figure 3:
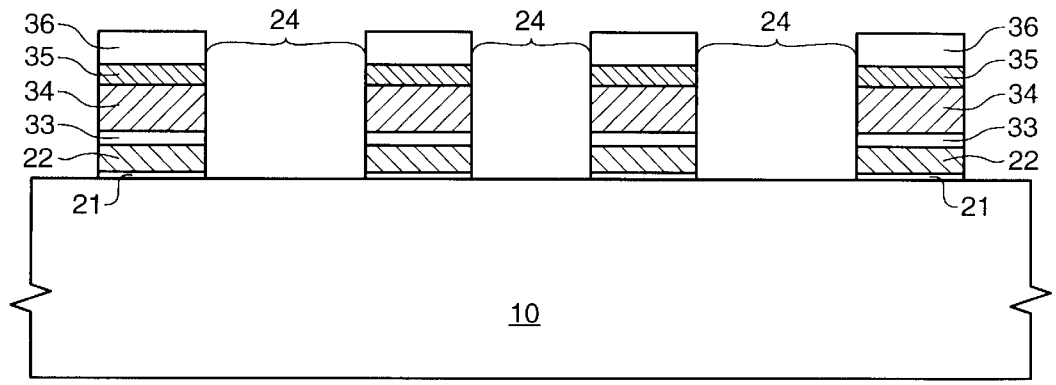
FIG. 3 is a cross-sectional view taken through line 2–2' of FIG. 1 after the formation of a transistor gate stack for a floating gate device.

FIG. 3 is a cross-sectional view of FIG. 1 taken through line 2–2'. Referring now to FIG. 3, various materials have been deposited and etched to form the transistor gate for each floating gate device. The transistor gate comprises tunnel oxide 21, a floating gate 22, an inter-polysilicon dielectric (such as an oxide/nitride/oxide stack) 33, polysilicon wordline 34, which is typically capped with tungsten silicide 35 and an oxide or nitride cap 36. It is preferred that a dielectric possessing a high dielectric constant of 3 or greater, such as $Al_2O_3$ be used for inter-polysilicon dielectric 33. FIG. 3 also shows the locations of active areas 24.

Figure 4:
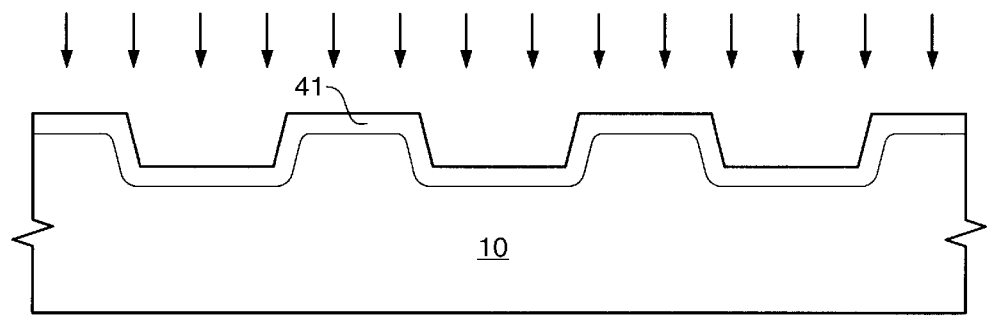
FIG. 4 is a cross-sectional view taken through line 3–3' of FIG. 1 after the removal of the shallow trench isolation oxide and an arsenic and/or phosphorous source implant.

FIG. 4 is a cross-sectional view taken through line 3–3' of FIG. 1. Referring now to FIG. 4, an etch (defined as a self-aligned source etch or SAS etch) is performed to remove shallow trench isolation oxide 26 (not seen).

Figure 5:
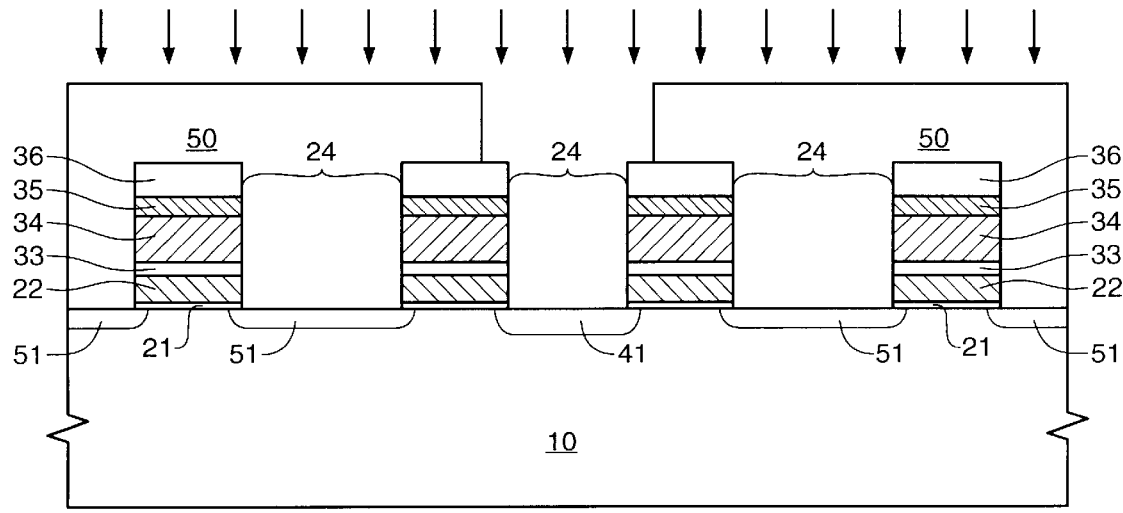
FIG. 5 is a cross-sectional view following the cross-sectional view of FIG. 3 taken after an arsenic and/or phosphorous source implant, followed by an arsenic and/or phosphorous source/drain blanket implant.

FIG. 5 follows the view of FIG. 3. As seen in FIG. 5, photoresist 50 is patterned and etched to expose underlying silicon 10 prior to a subsequent source implant. Referring now to both FIGS. 4 and 5, an arsenic and/or phosphorous source implant (also defined as a self-aligned source implant or SAS implant) is performed to form self-aligned source region 41, (shown in both FIGS. 4 and 5). Next, photoresist 50 is stripped and a blanket arsenic and/or phosphorous source/drain implant is performed which simultaneously forms drain regions 51 while also increasing the doping of the source region 41.

It is optional to eliminate both the SAS etch and the SAS implant and rely on the above mentioned subsequent source/drain implant to form the source and drain conductive regions. If the SAS etch is eliminated, trenches 25 would still contain oxide 26 (as seen in FIG. 2C). If the SAS implant is eliminated, a conventional array oxidation need not be performed, nor would array source/drain implant drive be necessary.

Figure 6:
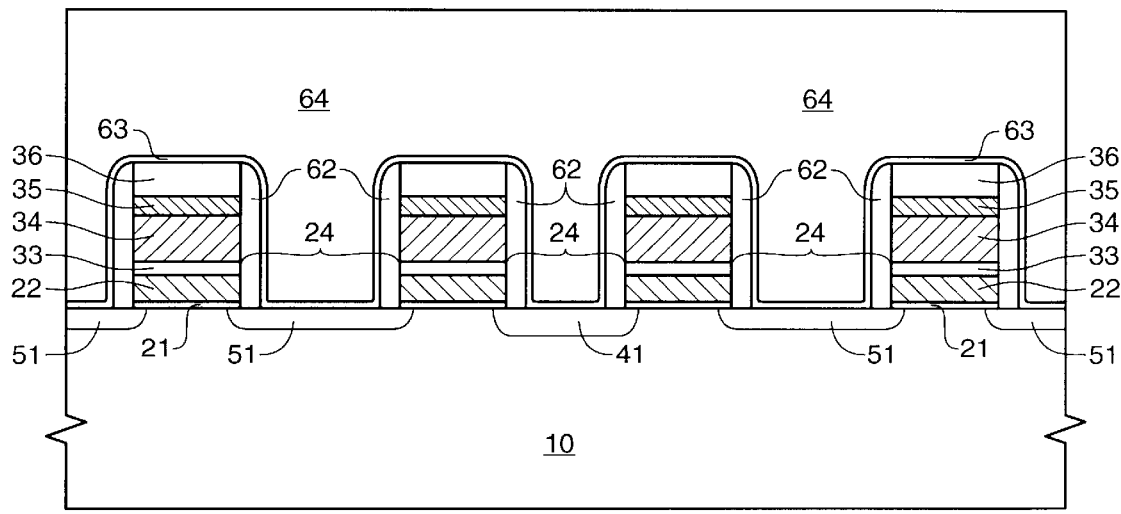
FIG. 6 is a cross-sectional view following the cross-sectional view of FIG. 5 taken after the formation of drain implants, transistor gate cap and spacers, followed by the deposition of a conformal layer of nitride and the formation of a planarized borophosphosilicate glass (BPSG) isolation layer.

FIG. 6 follows the view of FIG. 5. Referring now to FIG. 6, transistor isolation spacers 62 are formed. In the present invention, nitride or an oxynitride film is used in order to take advantage of the etch selectivity to oxide. Even though nitride is known to exert more stress than will oxide on underlying structures and possibly cause electrical changes, nitride is an effective etch stop material to use during the subsequently performed self-aligned contact etch. Following the formation of spacers 62, a conformal nitride etch stop barrier layer 63 is deposited which will cover source/drain regions 41 and 51 as well as cap 36 and spacers 62.

Nitride layer 63 will function as both an etch stop layer as well as a barrier layer if spacers 62 and caps 36 are formed from oxide. As a barrier layer, nitride layer 63 will prevent the diffusion of dopant atoms into any exposed active areas, such as the source and drain regions. Specifically, nitride layer 63 will prevent boron and phosphorous atoms from diffusing from a subsequently deposited BPSG layer into the underlying active areas, such as source region 41 and drain regions 51. Prior to the formation of barrier layer 63, an optional wet etch may be performed in order to ensure that spacers 62 are etched back sufficiently to allow subsequently formed metal (used to form the source and drain interconnects) adequately fill the self-aligned source via openings and the self-aligned drain via openings that are etched later in the process. Then the structure is covered with BPSG material 64 that is also planarized.

Figure 7:
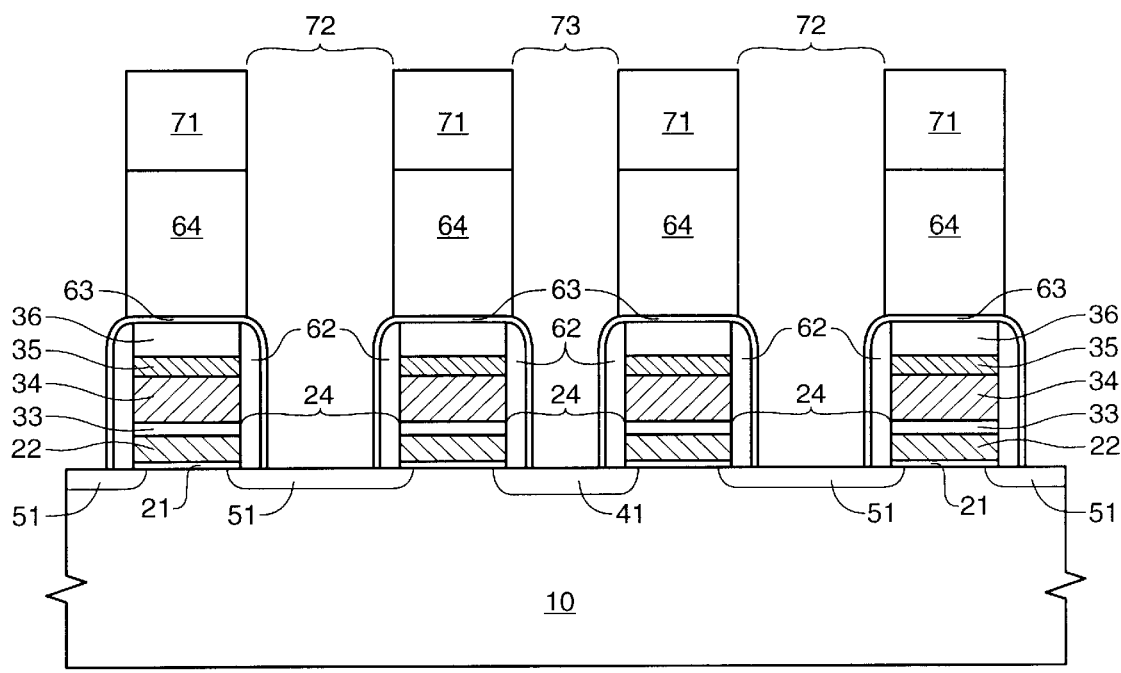
FIG. 7 is a cross-sectional view following the cross-sectional view of FIG. 6 taken after the patterning and etching of contact via opening to expose the source and drain of the floating gate device.

Referring now to FIG. 7, BPSG material 64 is patterned with photoresist 71 to allow for a subsequent via etch (also defined as the self-aligned source contact etch or a SAS contact etch) to form drain contact via openings 72 and source line via opening 73. The via etch removes exposed BPSG material 64 and stops on etch stop barrier layer 63. Next, an etch is performed to clear the conformal nitride from the surface of source/drain regions 41 and 51.

Figure 8:
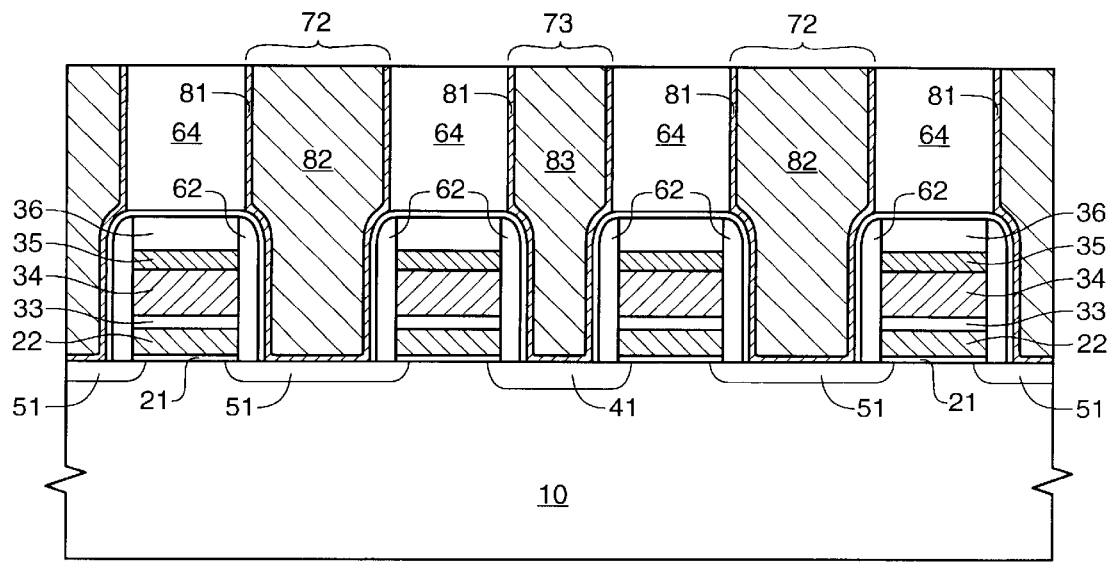
FIG. 8 is a cross-sectional view following the cross-sectional view of FIG. 7 taken after the formation of a planarized layer of tungsten/titanium to create self-aligned drain contact plugs and to create a tungsten/titanium local interconnect between each source.

Referring now to FIG. 8, photoresist 71 (seen in FIG. 7) is stripped and a conformal titanium nitride barrier layer 81 is deposited along the edges of via openings 72 and 73. Next, a metal such as a tungsten-based metal (solely tungsten or titanium tungsten) is formed to fill drain contact via openings 72 and source line opening 73. The metal is then planarized to form self-aligned drain contacts 82 (or plugs 82) and local interconnect 83 that is self-aligned to source 41. Drain contact plugs 82 will subsequently become connected between the drain of selected floating gate devices and a digit line.

Figure 9:
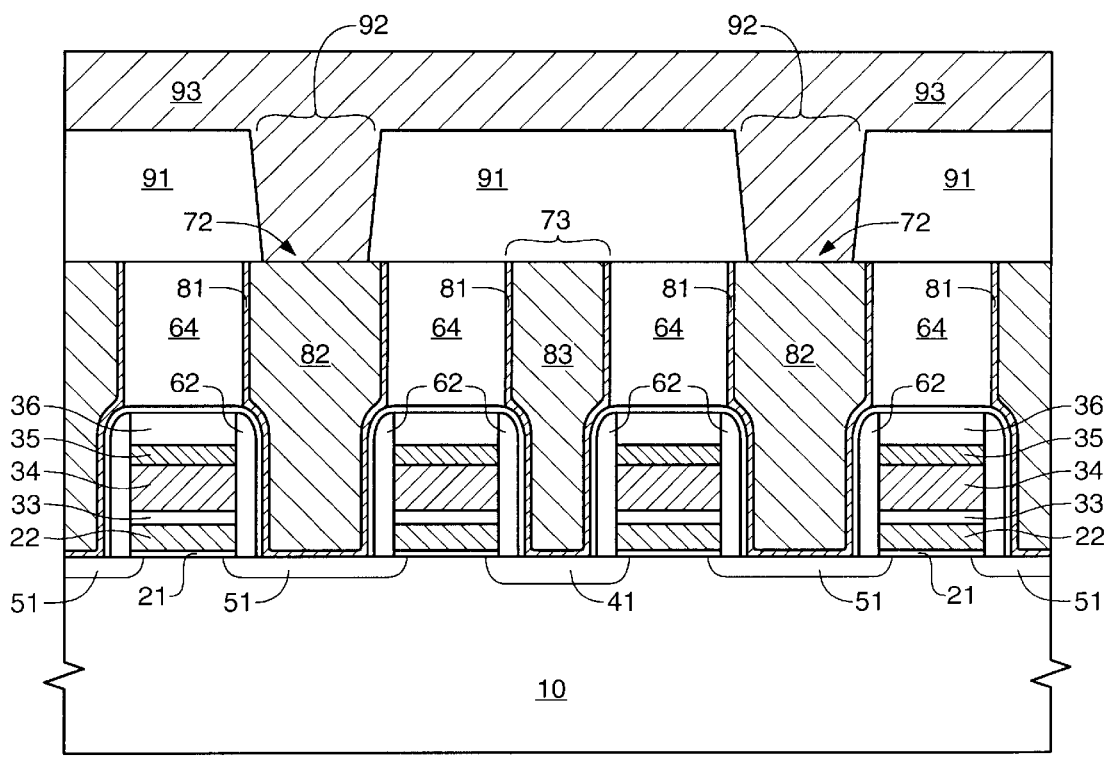
FIG. 9 is a cross-sectional view following the cross-sectional view of FIG. 8 taken after the formation of a planarized layer of inner layer dielectric material that is patterned and etched to provide via openings to expose the drain contact plugs which is followed by the formation of a planarized metal to make interconnects between the self-aligned drain plugs.

Referring now to FIG. 9, an inner layer dielectric material 91 is formed over the present structure of FIG. 8. Dielectric material 91 is planarized and then patterned and etched to form via openings 92 that expose underlying drain contact plugs 82. Next a metal 93 is formed that fills via openings 92. Metal 93 is planarized and serves as a digit line for the selected floating gate devices.

Figure 10:
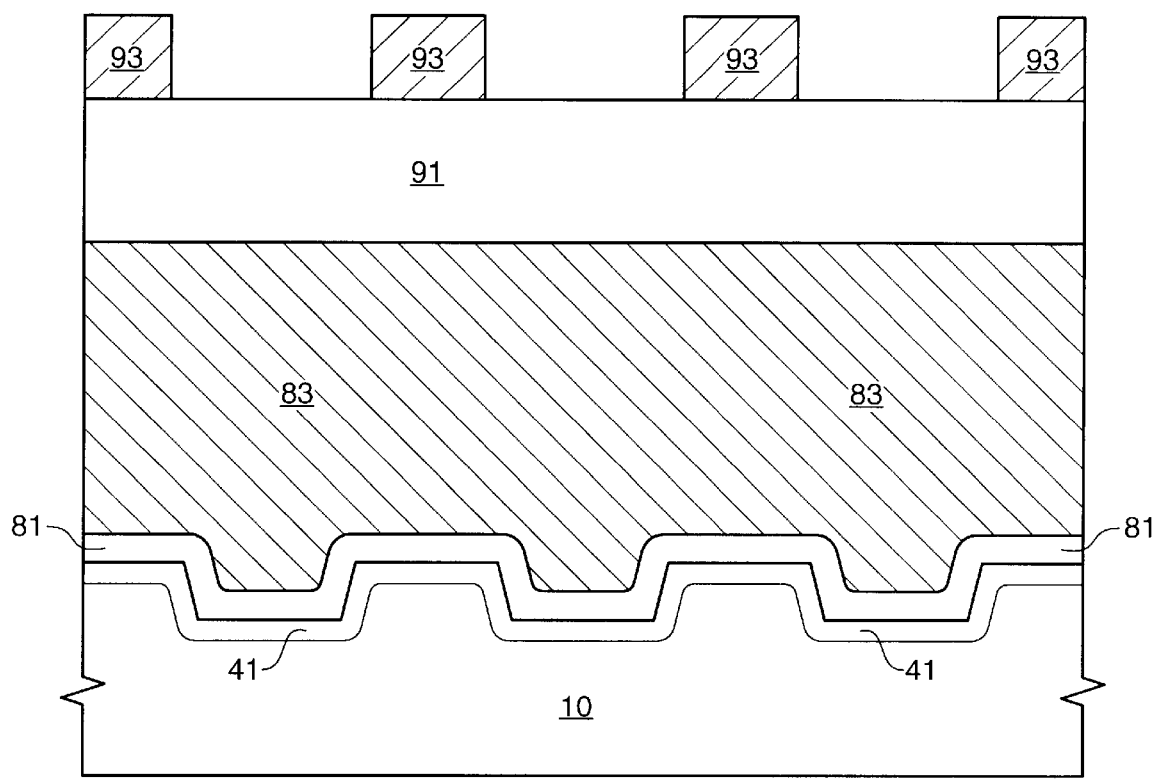
FIG. 10 is a cross-sectional view following the cross-sectional view of FIG. 4 taken after the formation of a planarized layer of tungsten/titanium to create a tungsten/titanium local interconnect between each source.

FIG. 10 is a cross-sectional view taken along the self-aligned source 41 of FIG. 1. Referring now to FIG. 10, local interconnect 83 makes connection to each source of a series of devices that are inner-connected by the self-aligned source implant. Important elements of the present invention are the combination of using metal local interconnect 83 with the self-aligned source 41, in conjunction with self-aligned drain contacts 82 (not seen in FIG. 10) that significantly lower source resistance and also allow the fabrication of a smaller floating gate device. The self-aligned source allows for a smaller cell simply by its inherent nature of being self-aligned to the transistor gate of each floating gate device. The lowered source resistance, due to the presence of the metal local interconnect, gives better cell performance uniformity when comparing the performance of a cell that is relatively close to a source contact versus a cell fairly far away from a source contact.

By employing the metal local interconnect, the overall size of the array can be reduced, as fewer source contacts will be needed compared to a conventional flash cell array. Most importantly, the metal local interconnect 83 connecting from source to source of series of devices will significantly reduce source resistance as the metal (such as a tungsten-based metal) provides a much better conducting line than does the conductively doped active area that forms the source for each device.

As demonstrated by the teachings of the present invention, the addition of a tungsten/titanium local interconnect to the source electrode, a self-aligned floating gate and a tungsten/titanium self-aligned drain electrode contact can be efficiently incorporated into conventional flash memory device fabrication methods.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A method for forming a flash memory device in a semiconductor assembly, comprising the steps of:
    forming a series of floating gate devices, each comprising a floating gate formed in a self-aligned manner to a respective transistor gate;
    forming a source electrode for each floating gate device and connecting each said source electrode together by a conductive implant into a defined region, said defined region having an upper surface;
    forming a metal interconnect having a lower surface substantially overlying only said upper surface of said defined region, said metal interconnect running a major length and major width of said upper surface of said defined region and making substantially continuous contact therebetween; and
    forming a metal drain plug for each said floating gate device of said series of floating gate devices such that each metal drain plug is self-aligned to a respective drain electrode.

2. The method of claim 1, wherein said step of forming a source electrode further comprises self-aligning each said source electrode to a respective transistor gate.

3. The method of claim 1, wherein said step of forming a series of floating gate devices further comprises forming nitride spacers and a nitride cap over each said transistor gate.

4. The method of claim 1, wherein said step of forming a metal interconnect comprises forming said metal interconnect from titanium/tungsten.

5. The method of claim 1, wherein said step of forming a metal drain plug comprises forming said metal drain plug from titanium/tungsten.

6. A method for forming a flash memory device on a semiconductor assembly comprising the steps of:
    forming a series of transistor gates each comprising a floating gate, each said floating gate formed in a self-aligned manner to a respective transistor gate;
    forming a source electrode for each floating gate device and connecting each source electrode together by a conductive implant into a defined active area, said defined active area having an upper surface;
    forming a nitride barrier layer overlying each transistor gate;
    fanning a planarized insulation layer over said nitride barrier layer;
    removing portions of said planarized insulation layer while using said nitride barrier layer to self-align an interconnect via opening to said source electrodes;
    forming a metal interconnect into said interconnect opening, said metal interconnect having a lower surface substantially lying directly on only said upper surface of said defined active area, said metal interconnect running a major length and spanning a major width of said upper surface of said defined active area and making substantially continuous contact therebetween; and
    forming a metal drain plug for each floating gate device of said series of floating gate devices, said metal drain plug sell-aligned and connected to an underlying drain electrode of each said floating gate device.

7. The method of claim 6, wherein said step of forming a source electrode further comprises self-aligning each said source electrode to a respective transistor gate.

8. The method of claim 6, wherein said step of forming a series of transistor gates further comprises forming nitride spacers and a nitride cap over each said transistor gate.

9. The method of claim 6, wherein said step of forming a metal interconnect comprises forming said metal interconnect from titanium/tungsten.

10. The method of claim 6, wherein said step of forming a metal drain plug comprises forming said metal drain plug from titanium/tungsten.

11. A flash memory device comprising:
    a series of floating gate devices having conductively implanted source electrodes interconnected by a common conductively doped region, said common conductively doped region having an upper surface, each floating gate device comprising a floating gate self aligned to a respective transistor gate;
    a metal interconnect having a lower surface substantially overlying only said upper surface of said common conductively doped region, said metal interconnect running a major length and major width of said upper surface of said common conductively doped region and making substantially continuous contact therebetween; and
    a metal drain plug for each said floating gate, said metal drain plug being self-aligned to a respective drain electrode.

12. The flash memory device of claim 11, wherein said source electrodes are self-aligned to a respective transistor gate.

13. The flash memory device of claim 11, wherein each transistor gates is insulated wit nitride spacers and a nitride cap.

14. The flash memory device of claim ii, wherein said metal interconnect comprises titanium/tungsten.

15. The flash memory device of claim 11, wherein said metal drain plug comprises titanium/tungsten.

16. A flash memory device for a semiconductor assembly comprising:
    a series of transistor gates each comprising a floating gate, each said floating gate being self-aligned to a respective transistor gate;

a source electrode for each floating gate device with each source electrode connected together by a conductively doped active area, said conductively doped active area having an upper surface;

a nitride barrier layer overlying each said transistor gate;

a planarized insulation layer overlying said nitride barrier layer;

a metal interconnect having a lower surface substantially lying directly on only said upper surface of said conductively doped active area, said metal interconnect running a major length and spanning a major width of said upper surface of said conductively doped active area and making substantially continuous contact therebetween; and a metal drain plug for each floating gate device being self-aligned and connected to an underlying drain electrode of each said floating gate device.

17. The flash memory device of claim 16, wherein said source electrodes are self-aligned to a respective transistor gate.

18. The flash memory device of claim 16, wherein each transistor gates is insulated with nitride spacers and a nitride cap.

19. The flash memory device of claim 16, wherein said metal interconnect comprises titanium/tungsten.

20. The flash memory device of claim 16, wherein said metal drain plug comprises titanium/tungsten.

* * * * *

UNITED STATES PATENT AND TRADEMARK OFFICE
CERTIFICATE OF CORRECTION

PATENT NO. : 6,706,594 B2 Page 1 of 1
APPLICATION NO. : 09/905517
DATED : March 16, 2004
INVENTOR(S) : Kelly T. Hurley It is certified that error appears in the above-identified patent and that said Letters Patent is hereby corrected as shown below:

Column 6, line 7, please replace " fanning " with -- forming --.

Column 6, line 22, please replace " sell-aligned " with -- self-aligned --.

Column 6, line 57, please replace " wit " with -- with --.

Column 6, line 59, please replace " ii " with -- 11 --.

Signed and Sealed this

Twenty-fifth Day of December, 2007

JON W. DUDAS
*Director of the United States Patent and Trademark Office*